Figure 1:
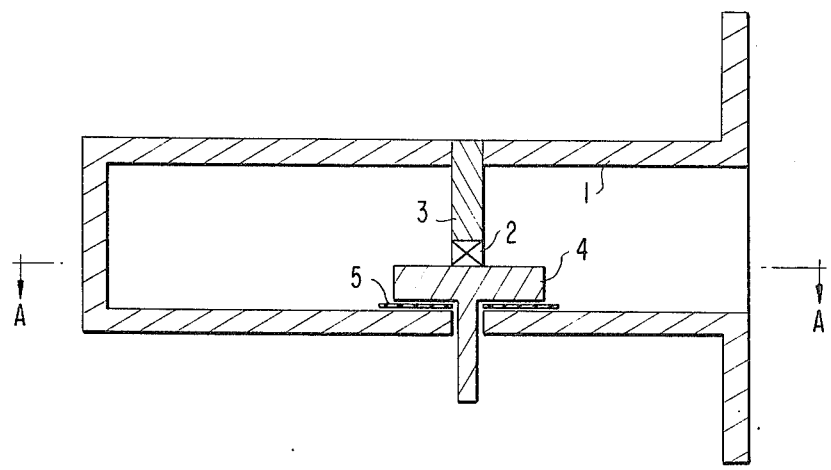

United States Patent [19]

Svensson

[11] 4,021,755

[45] May 3, 1977

[54] MICROWAVE OSCILLATOR HAVING NEGATIVE RESISTANCE DIODE INDUCTIVELY AND CAPACITIVELY MOUNTED IN WAVEGUIDE CAVITY

[75] Inventor: Stig Lennart Svensson, Akersberga, Sweden

[73] Assignee: Incentive AB, Stockholm, Sweden

[22] Filed: Sept. 5, 1975

[21] Appl. No.: 610,859

[30] Foreign Application Priority Data

Sept. 9, 1974 Sweden ............................ 7411345

[52] U.S. Cl. .............................. 331/96; 331/107 R
[51] Int. Cl.$^2$ ......................................... H03B 7/14
[58] Field of Search ............ 331/96, 107 R, 107 G, 331/107 T

[56] References Cited

UNITED STATES PATENTS 3,611,374  10/1971  Draysey .................. 331/107 G X

*Primary Examiner*—Siegfried H. Grimm
*Attorney, Agent, or Firm*—George H. Mitchell, Jr.

[57] ABSTRACT

A microwave oscillator comprises a wave-guide having a closed end with a semiconductor diode having a negative differential resistance for the frequency used placed in the wave-guide spaced from the closed end and electrically connected to two elements protruding inwardly from opposite walls of the wave-guide, with one of the elements being electrically isolated from the wall and having an unsymmetrical, rotatable body. The wave-guide may be conical if desired.

6 Claims, 2 Drawing Figures

MICROWAVE OSCILLATOR HAVING NEGATIVE RESISTANCE DIODE INDUCTIVELY AND CAPACITIVELY MOUNTED IN WAVEGUIDE CAVITY

The present invention refers to a microwave oscillator comprising a shorted stub wave-guide wherein at a certain distance from the shorted stub a semiconductor element with a negative differential resistance at the used frequency is arranged between two opposite walls in the wave-guide and is electrically coupled to two elements protruding from these walls at least one of which elements is electrically isolated from the wall of the wave-guide.

The recent development in the semi-conductor field has resulted in possibilities to directly generate microwave frequencies by using different types of microwave diodes with a negative resistance. Technically and economically microwave oscillators designed with such diodes have great advantages compared to oscillators made by electronic valves or transistors. In order to give such diode-oscillators the frequency stability required in the respective applications a microwave cavity is used to stabilize the frequency. The frequency stability obtained is determined by the factor of merit of the cavity itself and the factor of merit for the cavity with a connected outer load. The cavity consists of a shorted stub wave-guide provided with a cylindrical insert. The cylindrical insert consists of a wide plate isolated from the wave-guide and a thin pin on the top of the wave-guide, whereby the diode is mounted between the plate and the pin and electrically coupled to these elements. The cylindrical insert has two functions. Firstly, the thin pin represents an inductance in series with the diode and the bottom-plate represents a capacity connected in parallel with this circuit, whereby the inductance and the capacity together could be chosen so as to adapt the diode to the cavity, secondly the coupling of the signal-output to the oscillator is effected by the thickness of and the area of the bottom-plate. In order to achieve a cheap production it is desirable independently to effect the coupling of the signal-output to the oscillator and the adaption of the diodes to the cavity and doing this by maintaining a high figure of merit for the cavity. Previously the coupling of the microwave energy from the cavity to the load supplied by the oscillator has been varied by means of a separate screw which has been inserted in the wall of the wave-guide outside the diode. By inserting the screw at a different extent it is thereby possible to supply a desired part of the energy of the oscillator to the load. However, the insertion of this extra element is rather expensive and furthermore the introduction of threads in the cavity also means the introduction of a badly defined contact. It is the purpose of the present invention to provide a microwave oscillator of the type defined above whereby the coupling of the wave-guide output to the oscillator could be varied in a simple way without introducing any extra elements in the wave-guide. The characteristics of the invention will appear from the claims attached to this specification.

Figure 2:
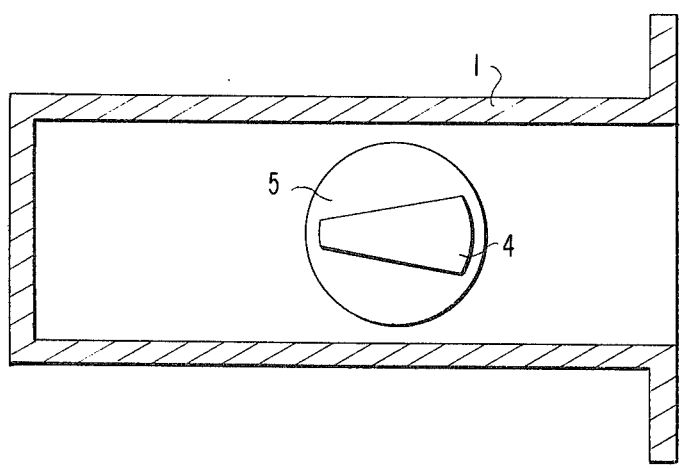

The invention will now be described in detail, reference being made to the enclosed drawing in which:

FIG. 1 shows a section through a microwave oscillator according to the invention and FIG. 2 is a section along the line A — A of FIG. 1.

In FIG. 1 reference 1 denotes a shorted stub wave-guide to be used as a microwave oscillator with a signal-output at the open end of the wave-guide. In the wave-guide there is provided a cylindrical insert at a certain distance from the closed end of the wave-guide, whereby the part of the wave-guide between the insert and the closed end is to be used as a resonance-cavity. The cavity is supplied with energy from a diode 2 which is arranged between a cylindrical pin 3 and a bottom-plate 4 both of which are made from a conductive material and constitute the contact elements of the diode by which the diode is supplied from a voltage source not shown in FIG. 1. The bottom-plate is thereby isolated from the wave-guide by means of a thin isolating plate 5, made, for instance, of mica. As stated above, the pin and the plate will act as an inductance and a capacity respectively in series with the diode, whereby this resonant circuit is adapted to the length of the resonant-cavity, i.e. the distance between the cylindrical insert and the closed end of the wave-guide. Furthermore the coupling of the signal-output is effected by the extension of the cylindrical insert. In order to make it possible to vary this coupling the bottom-plate 4 is designed not to be rotationally symmetrical, for instance it has the shape shown in FIG. 2 and furthermore, the complete insert could be turned from outside the wave-guide. By turning the cylindrical insert it is thereby possible to vary its extensionn in the direction towards the signal-output and thereby to vary the coupling of the signal-output to the oscillator without affecting the adaption of the diode to the cavity.

When turning the bottom-plate, one will also obtain a certain variation of the resonant-frequency of the cavity.

We claim:

1. A microwave oscillator comprising a shorted stub wave-guide, a semiconductor diode having a negative differential resistance for the frequency used, and two electrically conductive elements protruding inwardly from opposite walls of the wave-guide at a predetermined distance from the closed end of the wave-guide, said semiconductor diode being arranged between two opposite walls of the wave-guide and in electrical contact with said two elements, one of said elements being electrically isolated from the wall of the wave-guide and rotatable about the axis of said diode and said two elements and also being unsymmetrical with respect to said axis.

2. A microwave oscillator according to claim 1, characterized in that said one element includes a stem projecting outwardly from the wave-guide for rotation of said element.

3. A microwave oscillator according to claim 1, characterized in that the other of said two elements comprises an elongated pin extending in a plane tranverse to the length of the wave-guide.

4. A microwave oscillator according to claim 1, characterized in that a thin element of electrically nonconductive material is interposed between said one element and the adjacent wall of the wave-guide.

5. A microwave oscillator according to claim 4, characterized in that said one element is generally elongated and is rotatable about a transverse axis.

6. A microwave oscillator according to claim 5, characterized in that said wave-guide is conical.

* * * * *